(12) United States Patent
Meyer et al.

(10) Patent No.: US 6,880,133 B2
(45) Date of Patent: Apr. 12, 2005

(54) METHOD AND APPARATUS FOR OPTIMIZING DISTRIBUTED MULTIPLEXED BUS INTERCONNECTS

(75) Inventors: Michael Jude Meyer, Palo Alto, CA (US); Scott C. Evans, Santa Clara, CA (US); Kamil Synek, Sunnyvale, CA (US)

(73) Assignee: Sonics, Inc., Mountain View, CA (US)

( * ) Notice: Subject to any disclaimer, the term of this patent is extended or adjusted under 35 U.S.C. 154(b) by 0 days.

(21) Appl. No.: 10/146,989

(22) Filed: May 15, 2002

(65) Prior Publication Data

US 2003/0217347 A1 Nov. 20, 2003

(51) Int. Cl.⁷ .............................................. G06F 17/50
(52) U.S. Cl. .................. 716/1; 716/2; 716/12; 716/16
(58) Field of Search .......................... 716/1, 2, 12, 16

(56) References Cited

U.S. PATENT DOCUMENTS

| | | | | |
|---|---|---|---|---|
| 4,641,247 A | * | 2/1987 | Laugesen et al. ............... 716/1 |
| 4,685,104 A | * | 8/1987 | Johnson et al. ............. 370/369 |
| 4,799,216 A | * | 1/1989 | Johnson et al. ............. 370/364 |
| 5,577,023 A | * | 11/1996 | Marum et al. ............... 370/225 |
| 5,615,126 A | * | 3/1997 | Deeley et al. .................. 716/1 |
| 5,625,563 A | * | 4/1997 | Rostoker et al. ............... 716/2 |
| 5,627,480 A |   | 5/1997 | Young et al. |
| 5,732,246 A | * | 3/1998 | Gould et al. ................... 716/16 |
| 5,761,483 A | * | 6/1998 | Trimberger ...................... 716/2 |
| 5,847,580 A |   | 12/1998 | Bapat et al. |
| 5,850,537 A | * | 12/1998 | Selvidge et al. .............. 716/12 |
| 5,936,424 A |   | 8/1999 | Young et al. |

OTHER PUBLICATIONS

T. Minerd, Tme Division Multiplexed Bus for Machine Control, IEEE Industry Applications Magazine, pp. 50–56, May/Jun. 1997.*

P.G. Paulin et al., HAL: A Multi-paradigm Approach to Automatic Data Path Synthesis, 23rd Design Automation Conference, pp. 587–594, Jun. 1988.*

K. Choi et al., A Flexible Datapath Allocation Method for Architectural Synthesis, ACM Transactions on Design Automation of Electronic Systems, pp. 376–404, Oct. 1999.*

* cited by examiner

Primary Examiner—A. M. Thompson
(74) Attorney, Agent, or Firm—Blakely, Sokoloff, Taylor & Zafman, LLP

(57) ABSTRACT

A method and apparatus for optimizing distributed multiplexed bus interconnects are described. The multiplexed bus interconnect contains one or more multiplexers to route signals through the bus interconnect. An amount of signaling wiring present within a distributed multiplexed bus interconnect is optimized by eliminating individual signaling wires based upon whether an Intellectual Property core connected to the multiplexed bus interconnect transmits or receives signals from the distributed multiplexed bus interconnect.

28 Claims, 20 Drawing Sheets

Flowchart for optimizing timing constraints

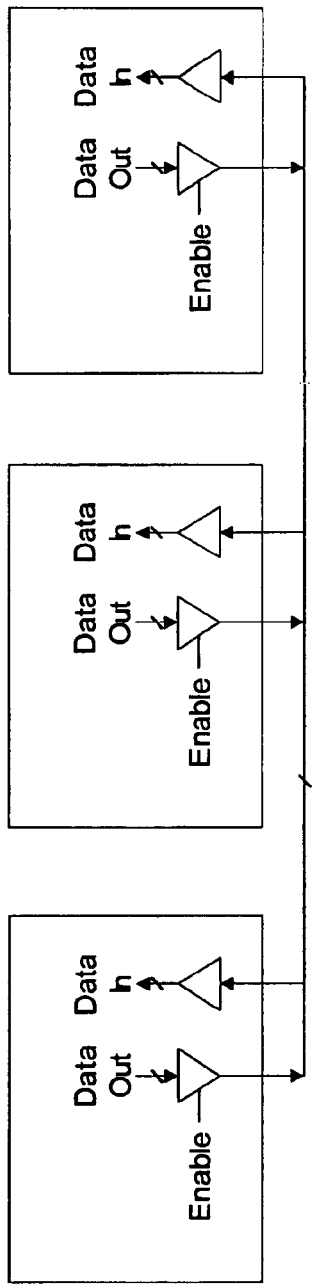
Figure 1A: Tri-State Bus (Prior Art)
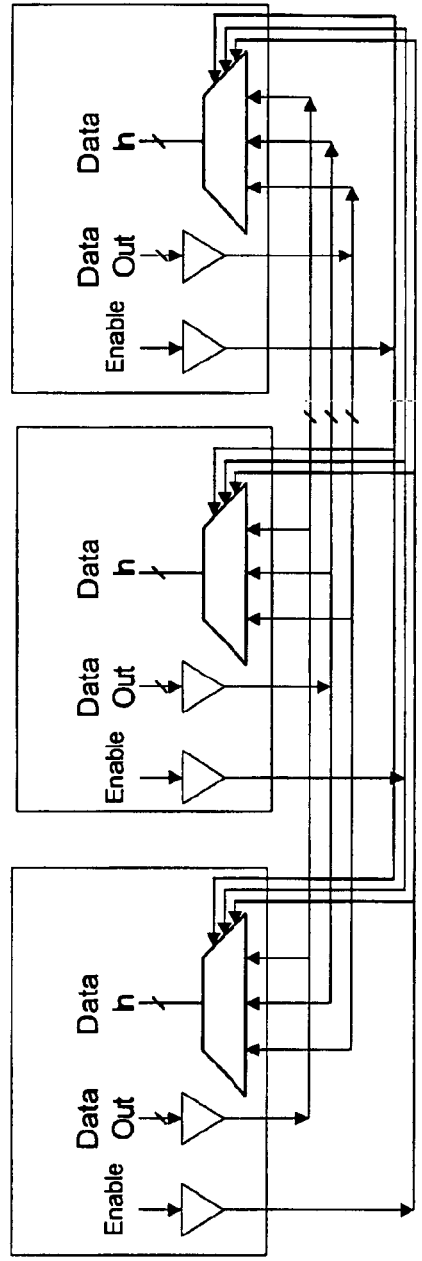
Figure 1B: Multiplexed Bus (Prior Art)

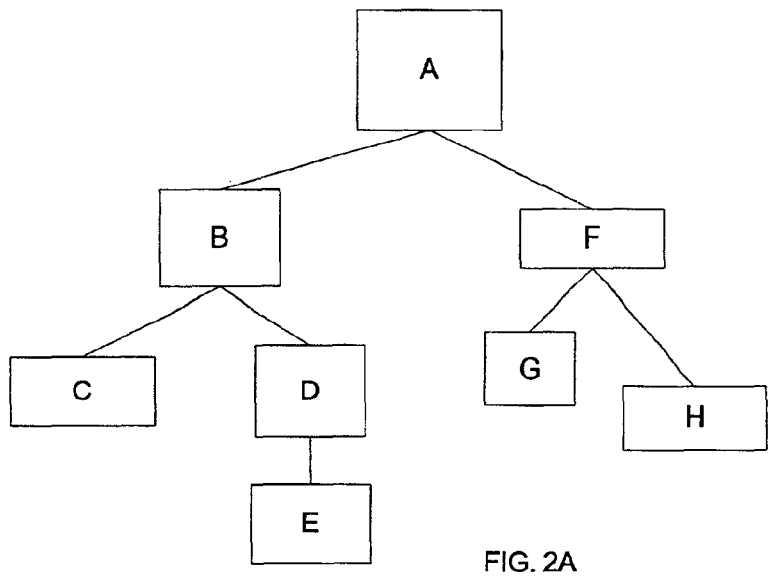
FIG. 2A
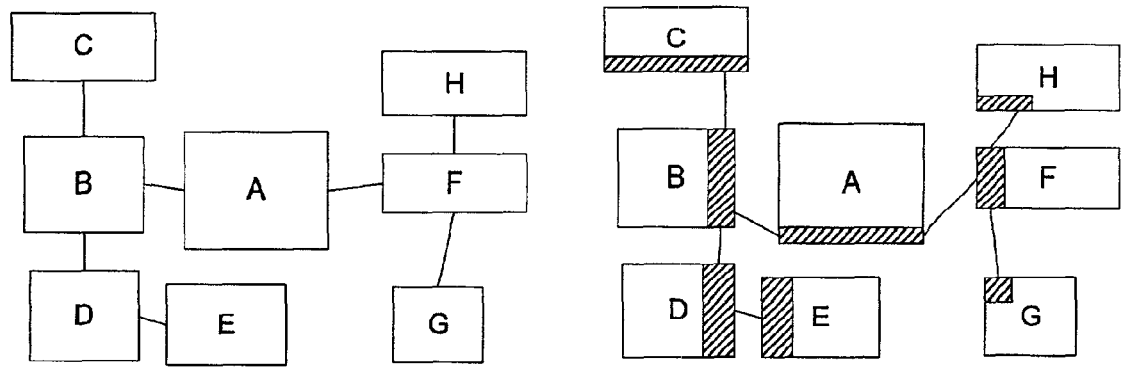
FIG. 2B
Core □  Agent ▨
FIG. 2C

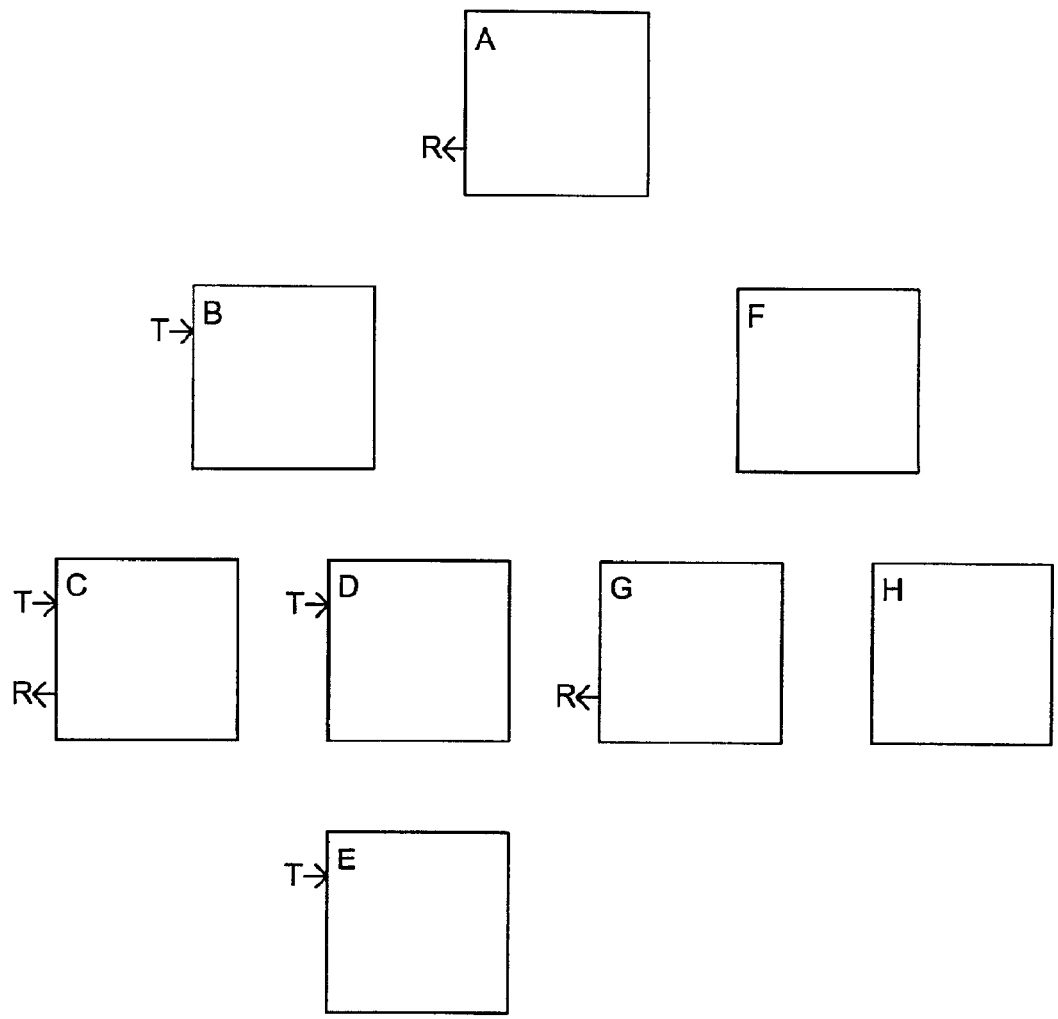
Given:
  Agents A, C and G have receivers
  Agents B, C, D and E have transmitters
Figure 3A: Receivers and Transmitters for specific bus signal

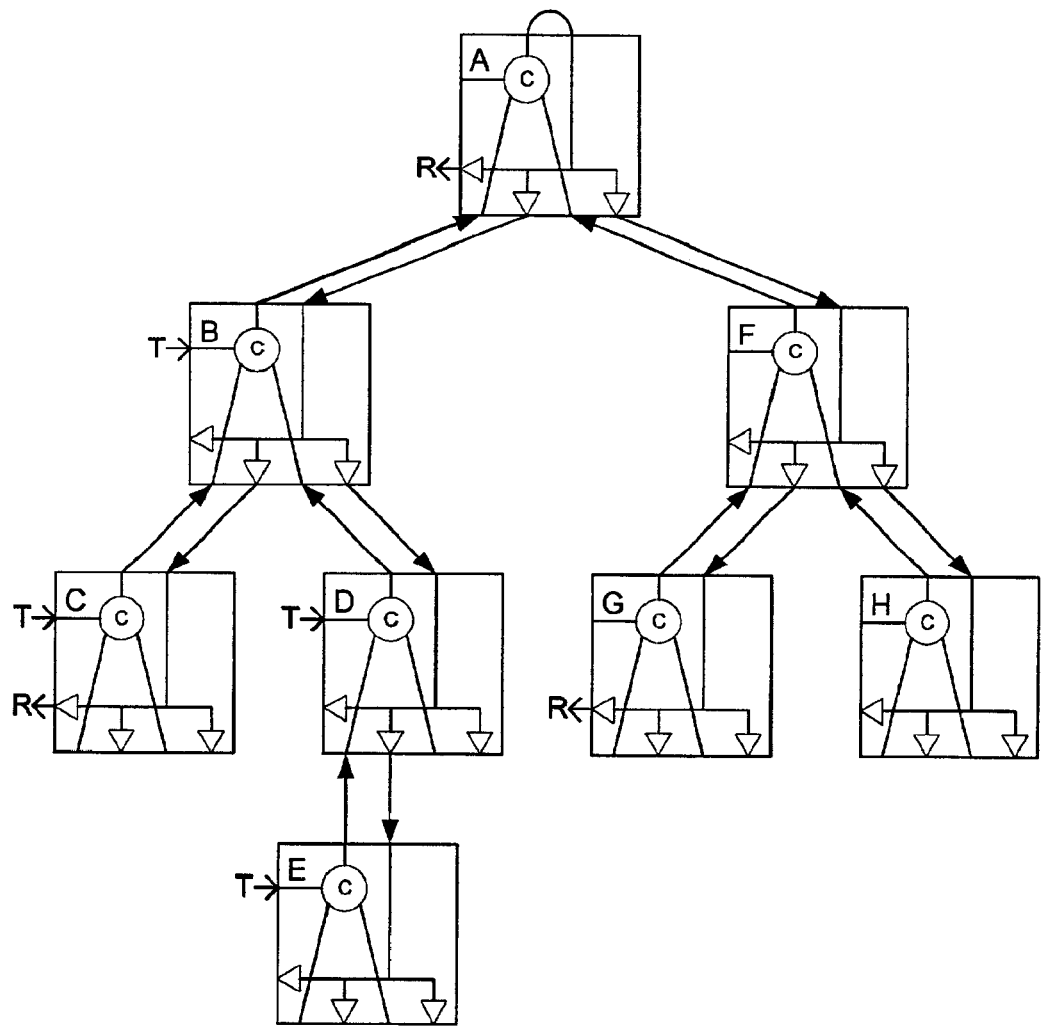
Figure 3B: Unoptimized connections for mux_tree A { B C { D E 0 } } { F G H }

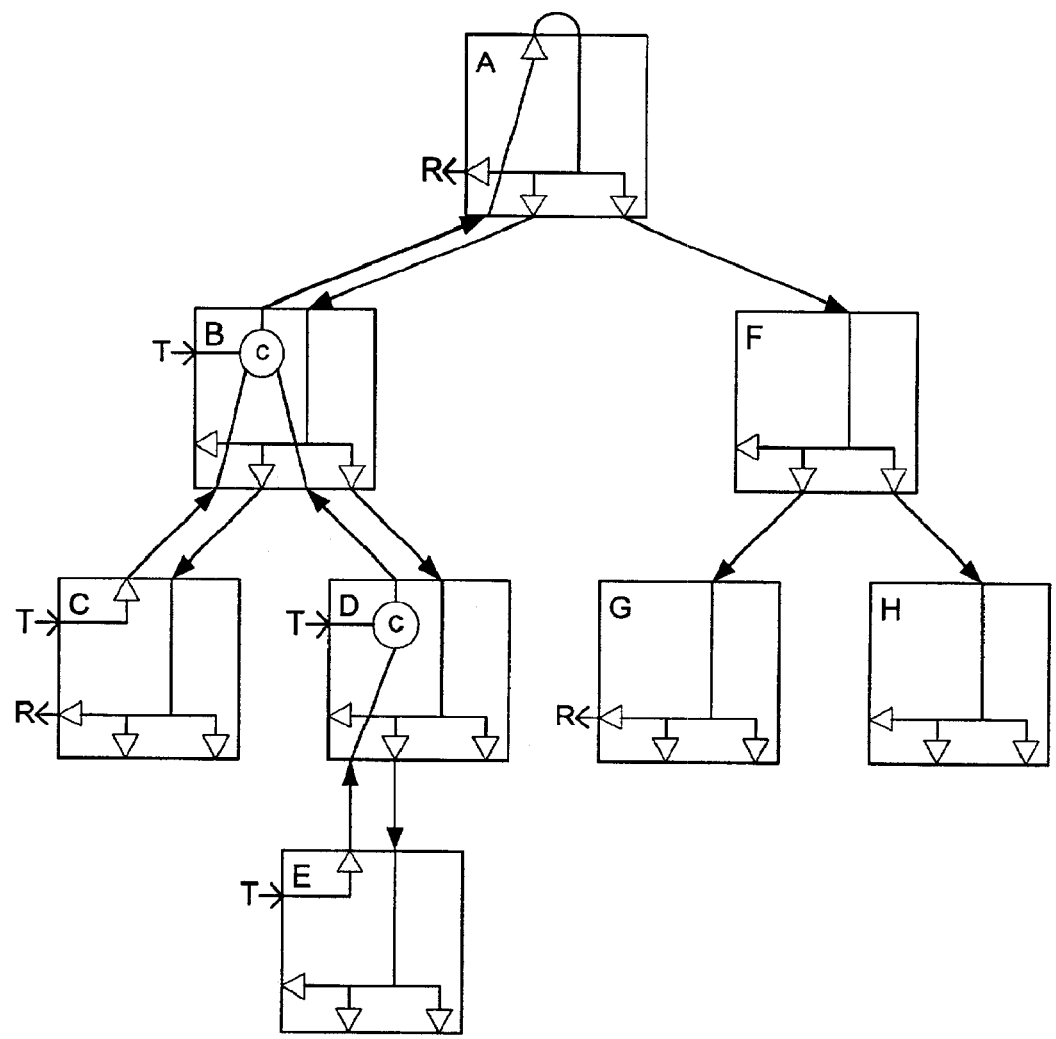
Figure 3C: After combiner optimization

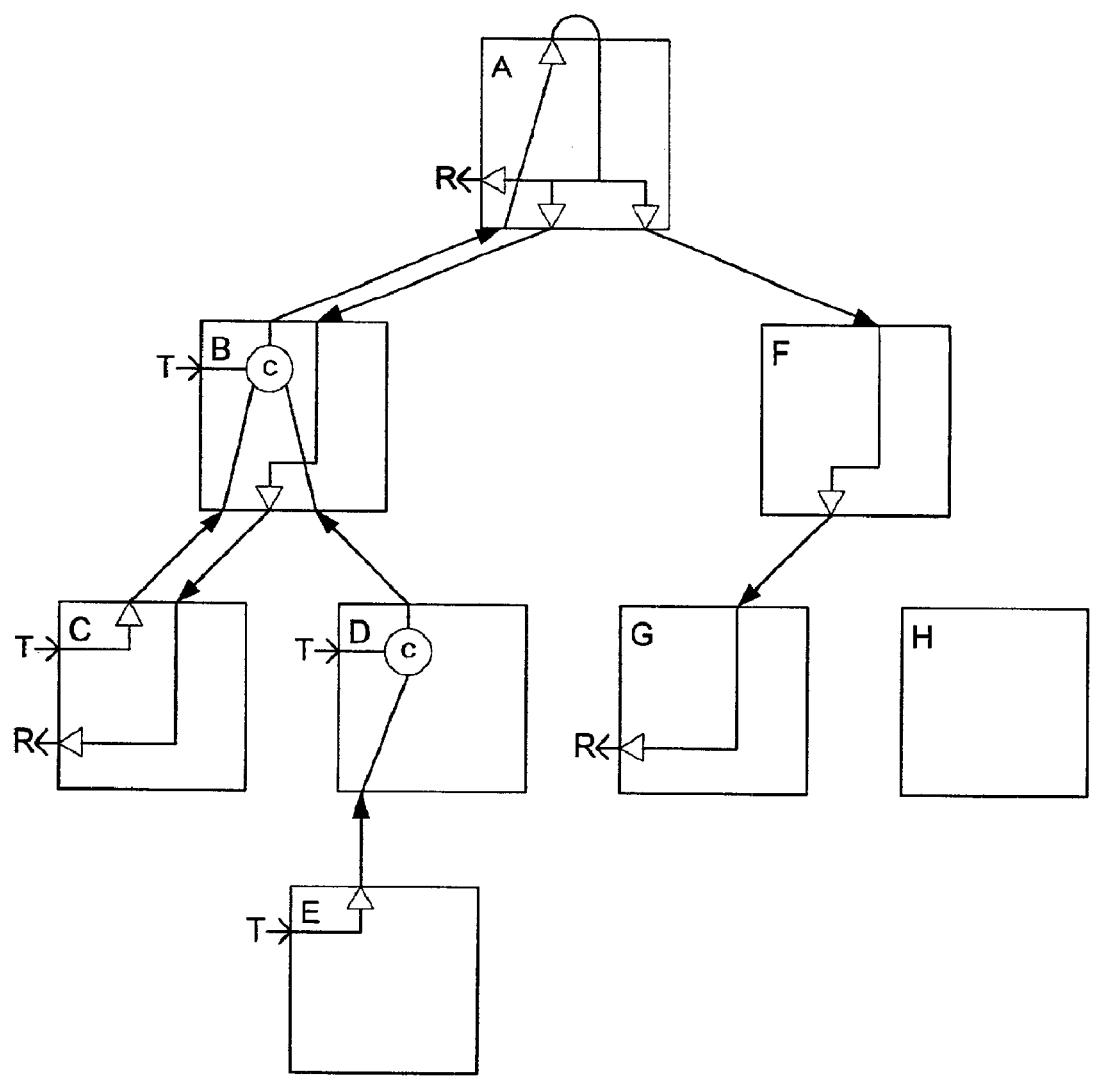
Figure 3D: After repeater optimization

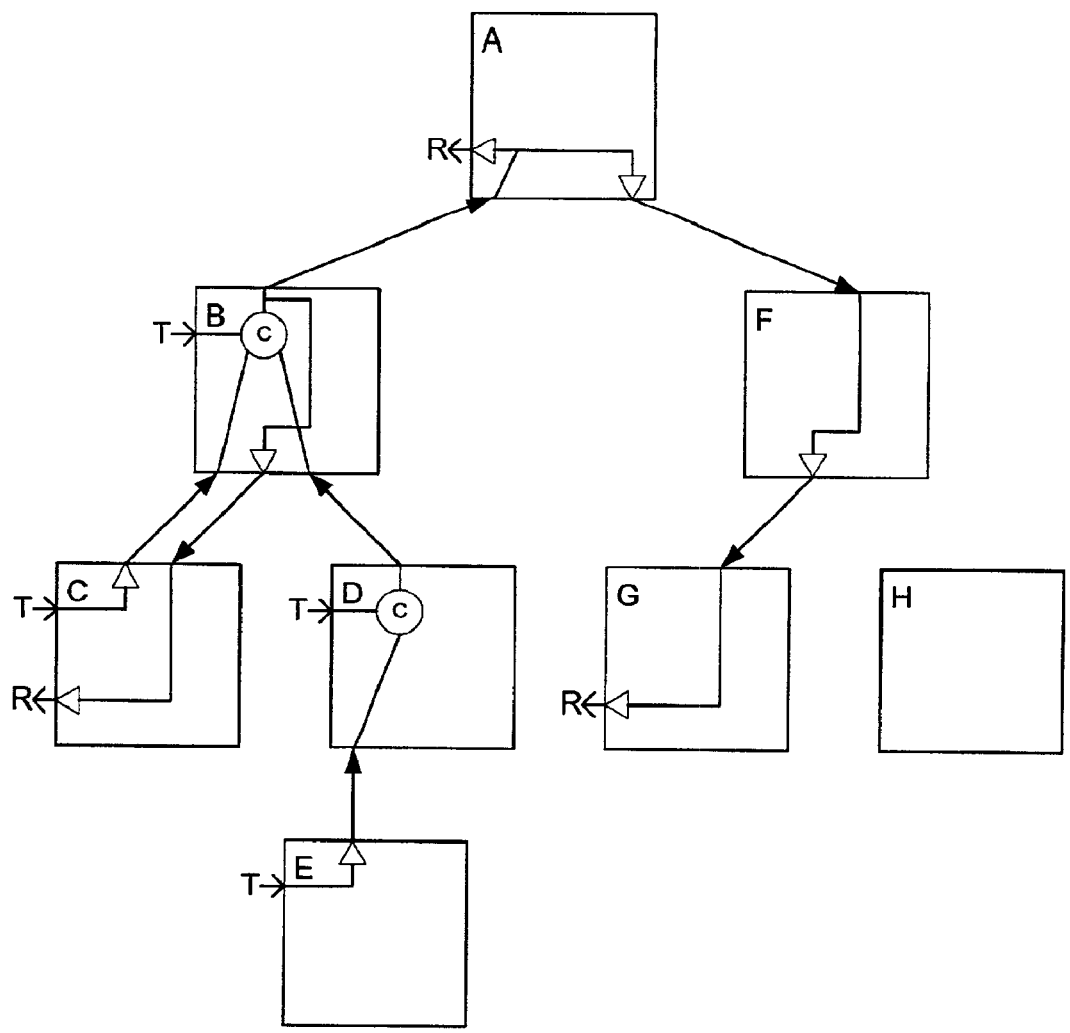
Figure 3E: After root optimization

Path A B D E F is a critical path and required to meet clock period.
Path A B C is much shorter but segment A must still meet timing requirement. Can only scale segment C.

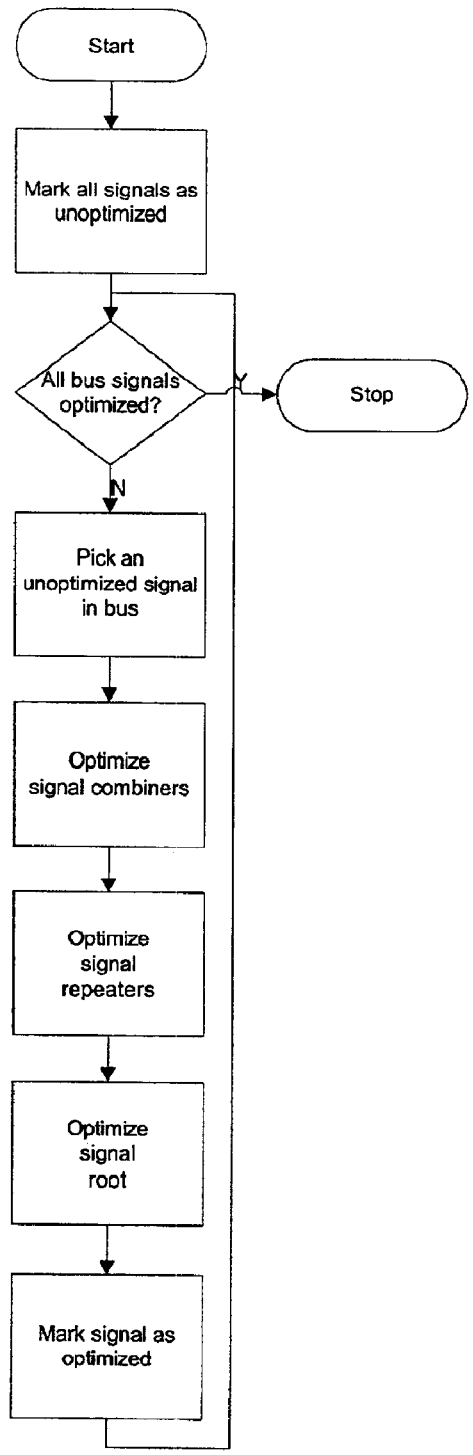
Figure 6A: Flowchart for Optimizing Bus Signal Wiring

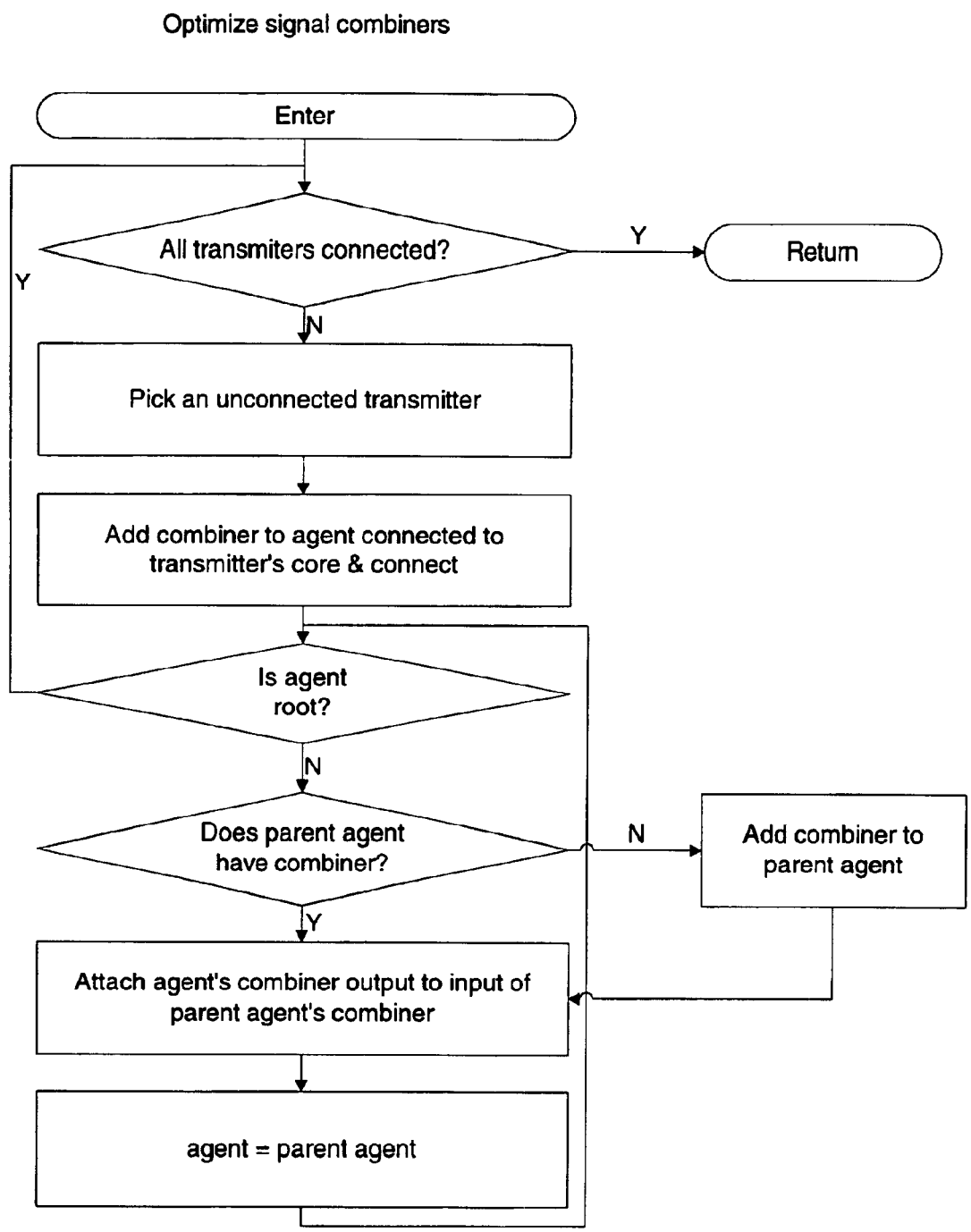
Figure 6B: Flowchart for Optimizing Combiners

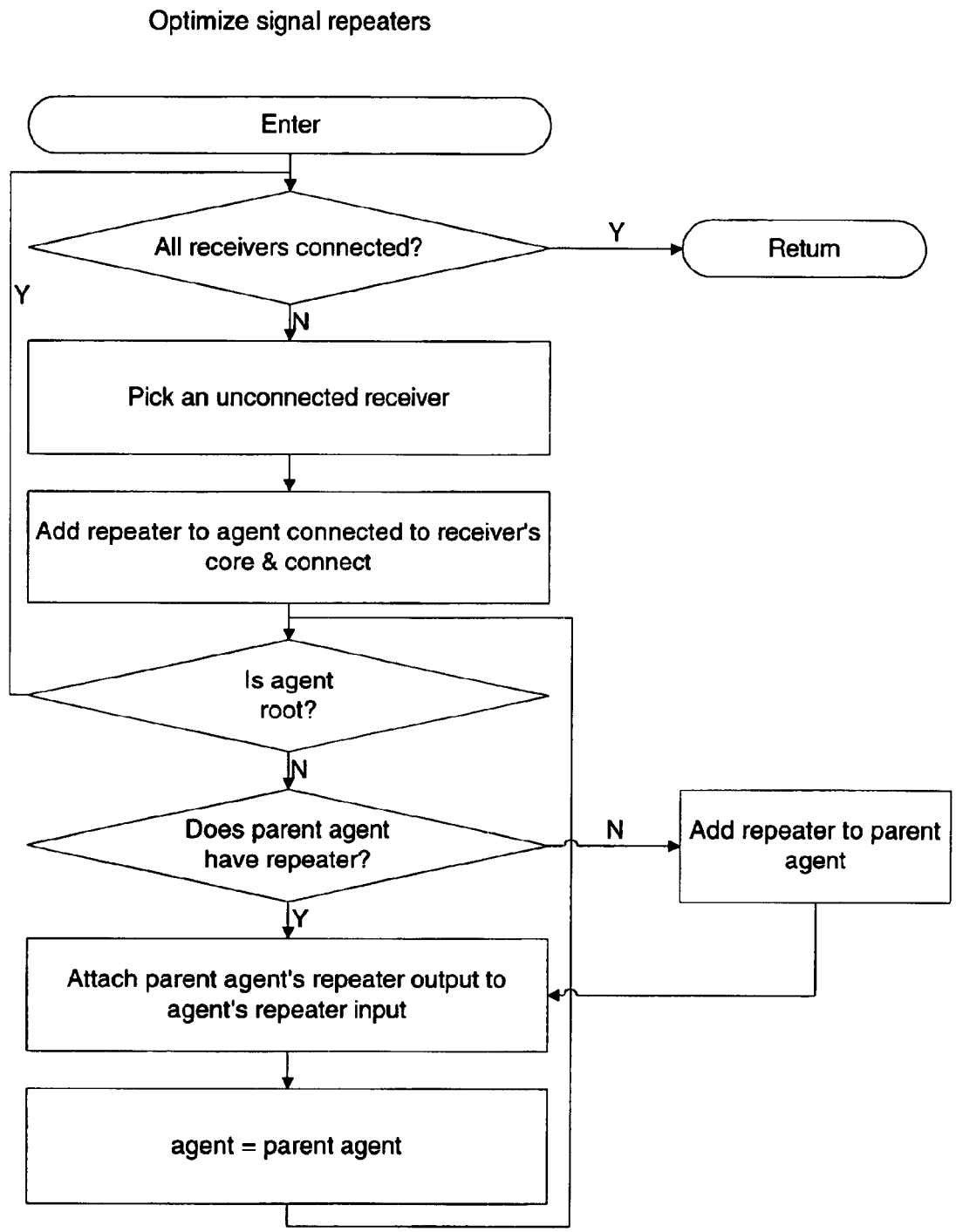
Figure 6C: Flowchart for Optimizing Repeaters

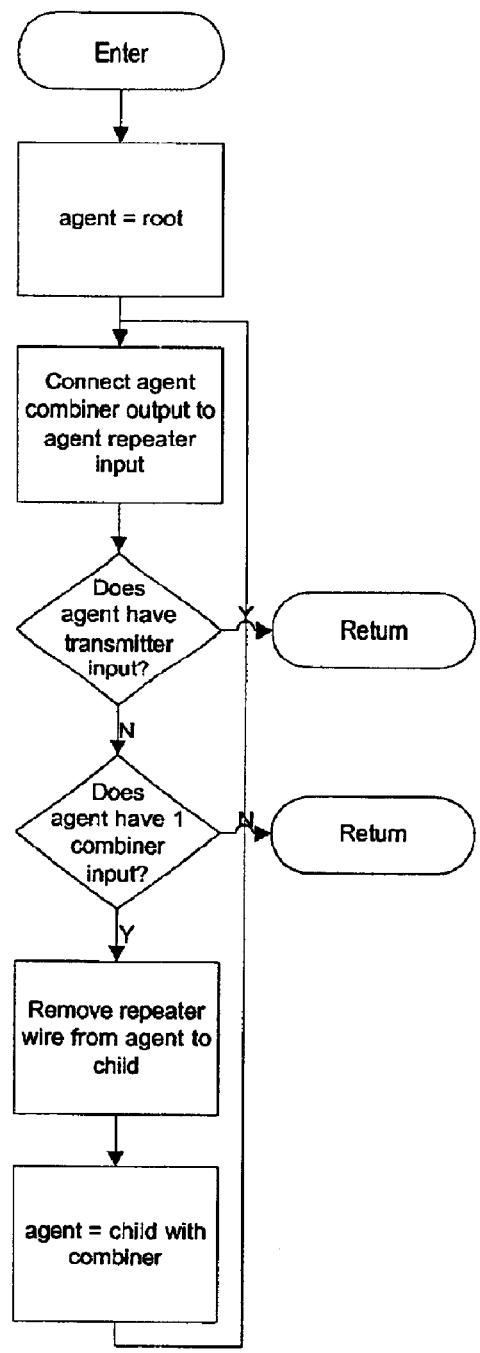
Figure 6D: Flowchart for Optimizing Root

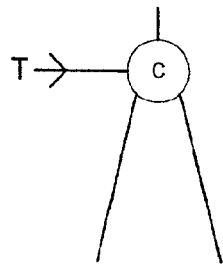
Figure 7A: The combiner block
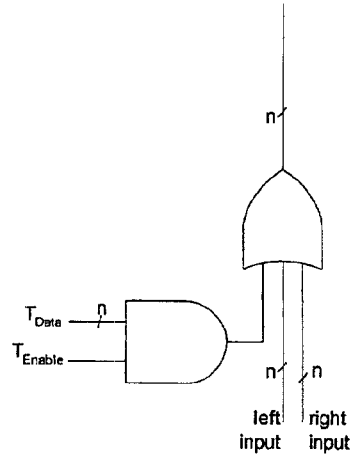
Tenable is a sing bit
while other a n-bit signals.
Figure 7B: Details of the combiner block
| Tenable | left input | right input | bus state |
|---------|------------|-------------|-------------|
| 0 | 0 | 0 | No conflict |
| 1 | !=0 | X | Conflict |
| 1 | X | !=0 | Conflict |
| X | !=0 | !=0 | Conflict |
Table 1: Conflict Detection
Figure 7C Flowchart for optimizing timing constraints

METHOD AND APPARATUS FOR OPTIMIZING DISTRIBUTED MULTIPLEXED BUS INTERCONNECTS

FIELD OF THE INVENTION

The present invention pertains to interconnections. More particularly, the present invention relates to a method and apparatus for optimizing distributed multiplexed bus interconnects.

BACKGROUND OF THE INVENTION

In computer networks, internetworking, communications, integrated circuits, etc. where there is a need to communicate information, there are often interconnections established to facilitate the transfer of the information. One approach is to use dedicated communication "lines" or links to transfer the information. A bus is usually used when more than two devices need to communicate. A traditional way to implement buses is using tristate bus drivers, where one device drives the bus and other drivers are disabled. Another approach is to have each device use a different set of wires and then to use a multiplexer to select the set of wires of the enabled device.

However, in multiplexing a bus, there may be communication points that may not need the full capabilities of the bus. Thus, extending a full bus to these entities may be wasteful of resources, such as space, power, etc. This may present a problem.

BRIEF SUMMARY OF THE INVENTION

Various methods and apparatuses are described for optimizing an interconnect. In an embodiment, an amount of signaling wiring present within a distributed multiplexed bus interconnect may be optimized by eliminating individual signaling wires based upon whether an Intellectual Property core connected to the multiplexed bus interconnect transmits or receives signals from the multiplexed bus interconnect. The multiplexed bus interconnect may contain one or more multiplexers to route signals through the multiplexed bus interconnect.

BRIEF DESCRIPTION OF THE DRAWINGS

The present invention is illustrated by way of example and not limitation in the figures of the accompanying drawings, in which like references indicate similar elements and in which:

FIG. 1A and FIG. 1B illustrate traditional buses;

FIG. 2A, FIG. 2B, and FIG. 2C illustrate embodiments of the present invention showing a topology;

FIG. 3A illustrates one embodiment of the present invention showing receivers and transmitters for a specific bus signal;

FIG. 3B illustrates one embodiment of the present invention showing unoptimized connections;

FIG. 3C illustrates one embodiment of the present invention showing a topology after a combiner optimization;

FIG. 3D illustrates one embodiment of the present invention showing a topology after a repeater optimization;

FIG. 3E illustrates one embodiment of the present invention showing a topology after a root optimization;

FIG. 6A illustrates one embodiment of the present invention showing a flowchart for optimizing bus signal wiring;

FIG. 6B illustrates one embodiment of the present invention showing a flowchart for optimizing combiners;

FIG. 6C illustrates one embodiment of the present invention showing a flowchart for optimizing bus repeaters;

FIG. 6D illustrates one embodiment of the present invention showing a flowchart for optimizing the root;

FIG. 7A illustrates one embodiment of the present invention showing a combiner block;

FIG. 7B illustrates another embodiment of the present invention showing a combiner block in more detail;

FIG. 7C illustrates one embodiment of the present invention showing a truth Table 1 for checking bus conflicts;

DETAILED DESCRIPTION

Figure 4A:
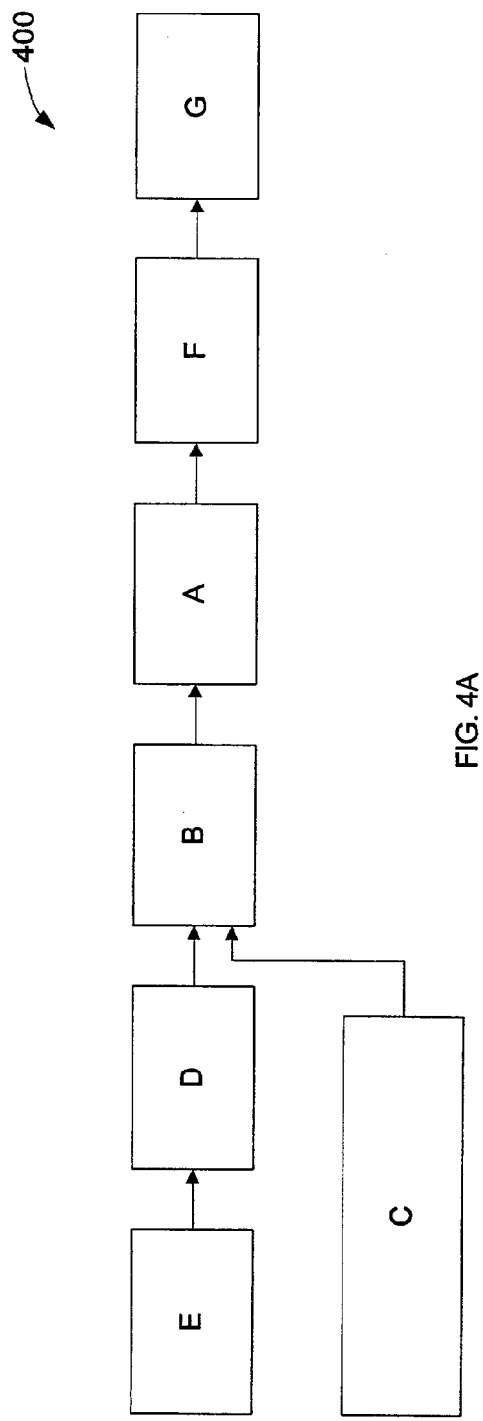
FIGS. 4A and 4B illustrate embodiments of the present invention showing interconnects and logic details.

A method and apparatus for optimizing distributed multiplexed bus interconnects are described.

The term IP as used in this document denotes Intellectual Property. The term IP, may be used by itself, or may be used with other terms such as core, to denote a design having a functionality. For example, an IP core or IP for short, may consist of circuitry, buses, communication links, a microprocessor, etc. Additionally, IP may be implemented in a variety of ways, and may be fabricated on an integrated circuit, etc.

Buses have traditionally been thought of as a string of blocks or connectors connected in a manner shown in FIG. 1A or FIG. 1B. This approach is simple and easy to implement. In Integrated Circuit (IC) design three-state (tri-states) (FIG. 1A) may not be desirable because of the difficulty in adding repeaters to wires that have multiple drivers and buses are commonly implemented via multiplexers. A multiplexer implementation requires a wire from each transmitter to each receiver, which may create a potential for wiring congestion. Another approach is to implement distributed multiplexers, where logic at each block merges signals from other blocks and then possibly fewer wires to the next device. Traditionally bus implementations have either assumed that signals on a bus are a receiver, transmitter, or a transceiver.

Describing a distributed multiplexed bus topology may be done in a variety of ways. For simple linear topology a list can express the order blocks are connected. However, for more complex topologies where more than one node are merged at any node a tree is a better way to describe the topology. The user may describe the topology of a bus in a parse-tree like syntax, such as:

```
mux_tree <sub-tree>
<sub-tree> ::= <root> <branch> <branch>
<root> ::= <instance-name>
<branch> ::= { <sub-tree> }
    | <instance-name>
    | 0       (a sentinel to indicate no connection)
```

An example tree might be:

mux_tree A {B C{D E}}{F G H }

This line above describes the connectivity between blocks that topologically looks like FIG. 2A. When the design is implemented in an IC, the blocks may appear as blocks in FIG. 2B. Each node in the tree may communicate with an IP core, optionally a parent node, and optionally a set of child nodes. Each node consists of an IP core and an agent as shown in FIG. 2C. The distributed multiplexer (and potentially other functions) may be implemented in the agent. Depending on how the multiplexed bus is connected, the agents may need to be changed, however the core may be unaffected. This may enable reuse of a core without having to change it when the bus changes. FIG. 3A shows the receivers and transmitters for each agent in this example. For this signal of the bus in this example Agents A, C and G need to receive the signal, while Agents B, C, D, and E may transmit it. There may be additional logic in the agent to perform other protocol conversion between these receiver and transmitter interfaces and an actual IP core. Given this transmitter and receiver configuration and the mux_tree specification described above, the agents are wired together as shown in FIG. 3B. Note that the output of the mux tree root is connected back to the mux tree root repeater input. The combiner function (FIG. 7A) takes as input data an enable from the core or other agent logic and the combiner output of the sub trees. FIG. 7B shows the "and-or" implementation of the combiner.

A tree structure may result in less wiring and/or shorter end-to-end paths than the simple linear wiring. The structure may be specified by the user and/or a program may find the minimal spanning tree. By routing signals using the same topology it may be possible to create predictable wiring delay and/or reduce congestion. Two sets of wires are used between two topologically adjacent nodes: the first may be used to combine the results, and the second may be used to distribute the result back to all nodes.

Optimizing signal wiring in a distributed multiplexed bus may be done by examining nodes. For example, some nodes may not generate (transmit) certain signals, while other nodes may not use (receive) certain signals. Routing all signals to all nodes may require more wiring and may increase the end-to-end path length for a signal. By removing combining wires from nodes that do not drive the signal and/or the distribution wires to nodes that do not use the result may allow a reduction in the area by requiring fewer drivers and/or less wire, potentially improving chip timing by shortening critical paths, and/or reducing power by using smaller drivers to achieve the same timing.

FIG. 6A illustrates one embodiment of the present invention of a high level algorithm for optimizing bus signal wiring. Note that the sequence need not be performed in a specific order, however the illustrated order is easy to implement. Each signal is analyzed and unnecessary transmitters and receivers are removed. Signals in the bus are optimized individually since each signal may have different transmitters and receivers topologies based on the core function and the bus protocol. The algorithm for removing these unnecessary wires is given below: Given a tree with a root and a list of bus_signals:

```
foreach signal in bus_signals {
    optimize_combiners(root,signal);
```

```
    optimize_repeaters(root,signal);
    optimize_root(root,signal);
}
```

The removal of unnecessary combiners may reduce the amount of wiring used to connect blocks at the top level of the chip and/or may shorten the path of some signals so they may be better optimized for timing, area, power, etc. The optimization of the combiners, in one embodiment of the present invention, may be done by a bottom up removal of unnecessary combiners for a specific signal. A combiner is unnecessary in an agent if the core attached to the agent and other agent logic does not have a transmitter and none of the children in the sub-tree have a combiner. FIG. 6B illustrates in a flow chart, one embodiment of the present invention for optimizing the insertion of combiners. The optimization of combiners may be either additive as shown in FIG. 6B, and/or subtractive as shown in the recursive algorithm as is given below:

```
procedure optimize_combiners(sub_tree,signal) {
    has_combiner = node_needs_combiner(sub_tree.node,signal)
    foreach child in sub_tree.children
        if (optimize_combiners(child,signal)) {
            has_combiner = true
        }
    if (!has_combiner)
        remove_combiner(sub_tree.node,signal)
    return has_combiner
}
```

FIG. 3C illustrates the effect of optimizing combiners. Combiners have been removed from agents F, G, and H. If a combiner has one input, then the "or" function can be replaced by a buffer if the input is from a sub-tree or a combiner's "and" of the data and enable.

Unused repeaters may be optimized by removal of unnecessary repeaters for a specific signal. This may have timing, area, power, etc. benefits. A repeater is unnecessary for an agent if the core attached to the agent and other logic in the agent does not have a receiver and none of the children in the sub-tree have a repeater. FIG. 6C illustrates a flowchart, for one embodiment of the present invention, for adding repeaters to the mux tree. The repeater optimization process may be additive as shown in FIG. 6C, and/or it may be subtractive as show in the algorithm below:

```
procedure optimize_repeaters(sub_tree,signal) {
    has_repeater = node_needs_repeater(sub_tree.node,signal)
    foreach child in sub_tree.children
        if (optimize_repeaters(child,signal)) {
            has_repeater = true
        }
    if (!has_repeater)
        remove_repeater(sub_tree.node,signal)
    return has_repeater
}
```

FIG. 3D illustrates the effect of optimizing repeaters. Repeaters have been removed from agents D, E and H.

If all the transmitters are in one sub-tree, then wires from the root of the entire tree to the root of that sub-tree used for returning the result may be removed as this node can drive the result directly to the sub-tree and to the root. FIG. 6D illustrates the flowchart for optimizing the root for a signal, while example pseudo-code is given below:

```
procedure optimize_root(sub_tree,signal) {
    if node_needs_transmitter(sub_tree,signal)
        connect_combiner_to_repeater(sub_tree.root);
        return;
    new_root = NULL
    foreach child in sub_tree.children {
        if (node_needs_transmitter(child,signal)) {
            if (new_root != NULL) {
                return;
            }
            new_root = child;
        }
    }
    if (new_root != NULL)
        optimize_root(child,signal)
}
```

FIG. 3E illustrates the effect of optimizing the root. In this example, the repeater wire connecting A and B has been removed and agent B acts as the root for this signal.

Figure 4B:
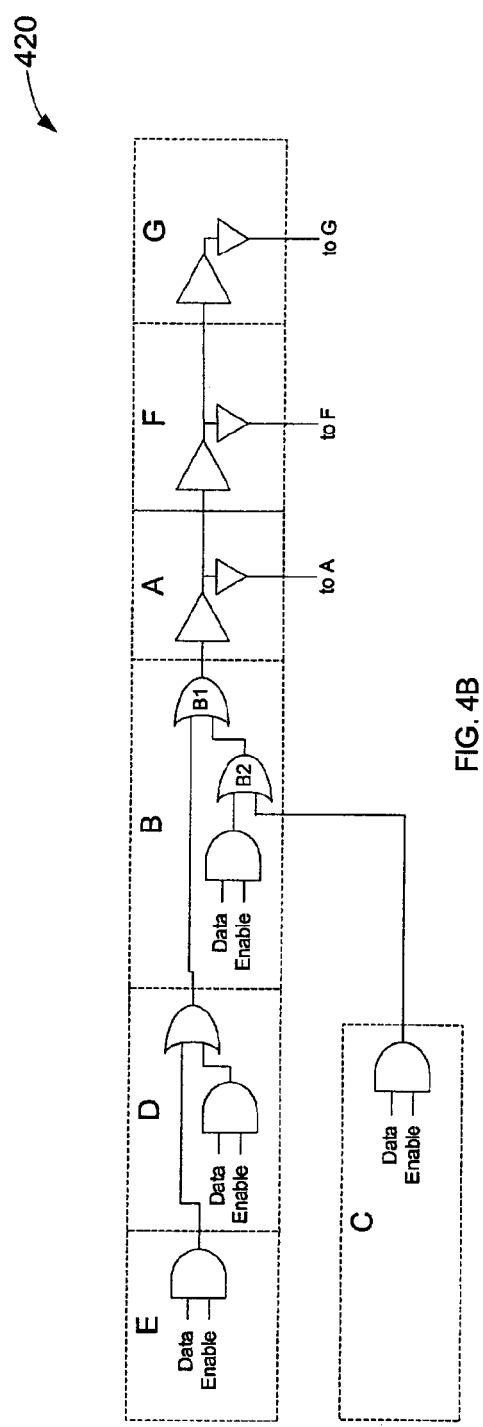
Figure 5:
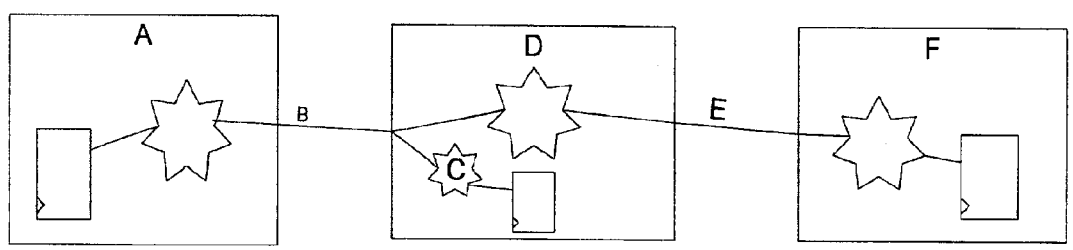
FIG. 5 illustrates one embodiment of the present invention showing timing paths.
Figure 8A:
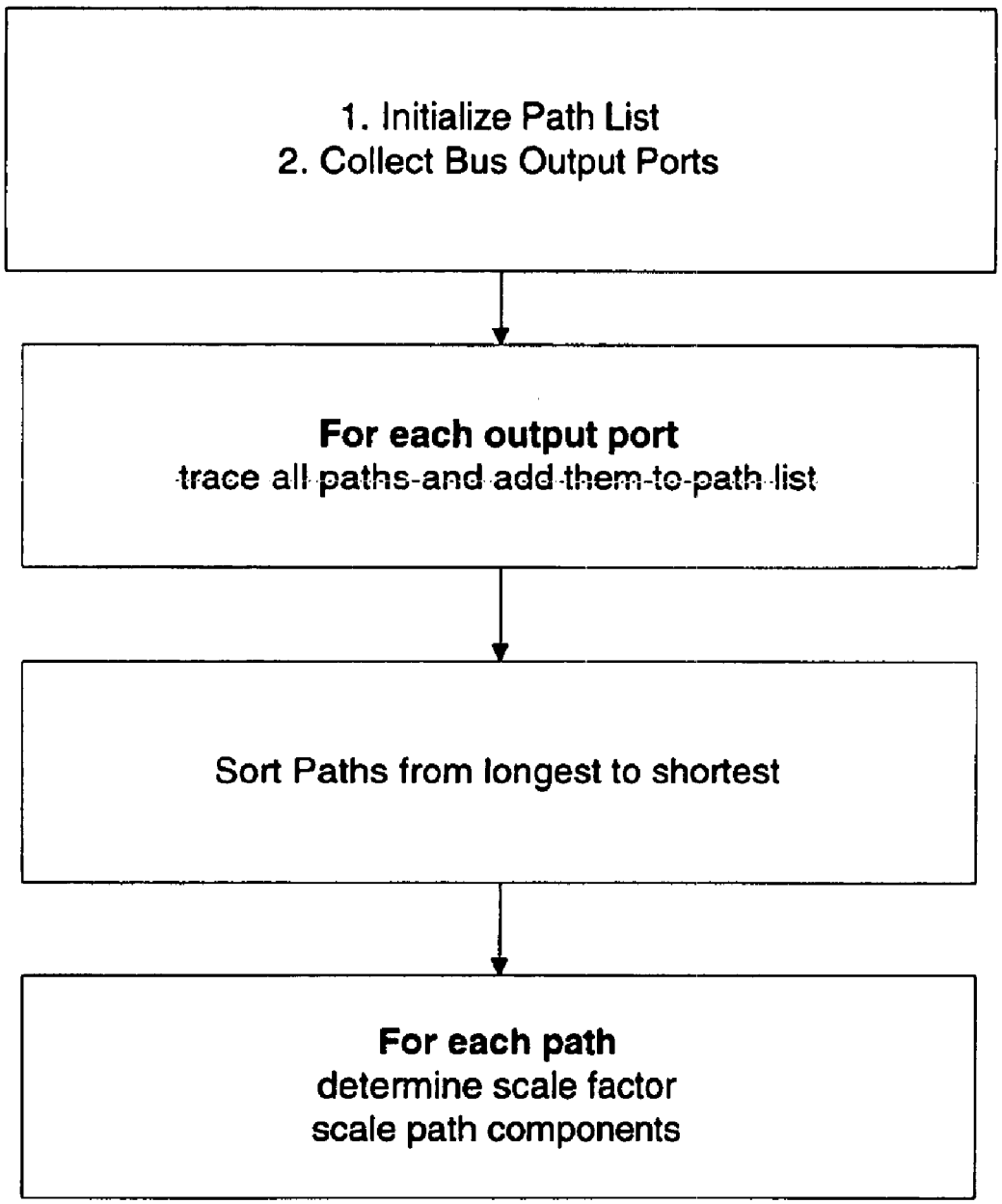
FIGS. 8A–8D illustrate various embodiments of the present invention showing optimizing timing constraints.
Figure 8B:
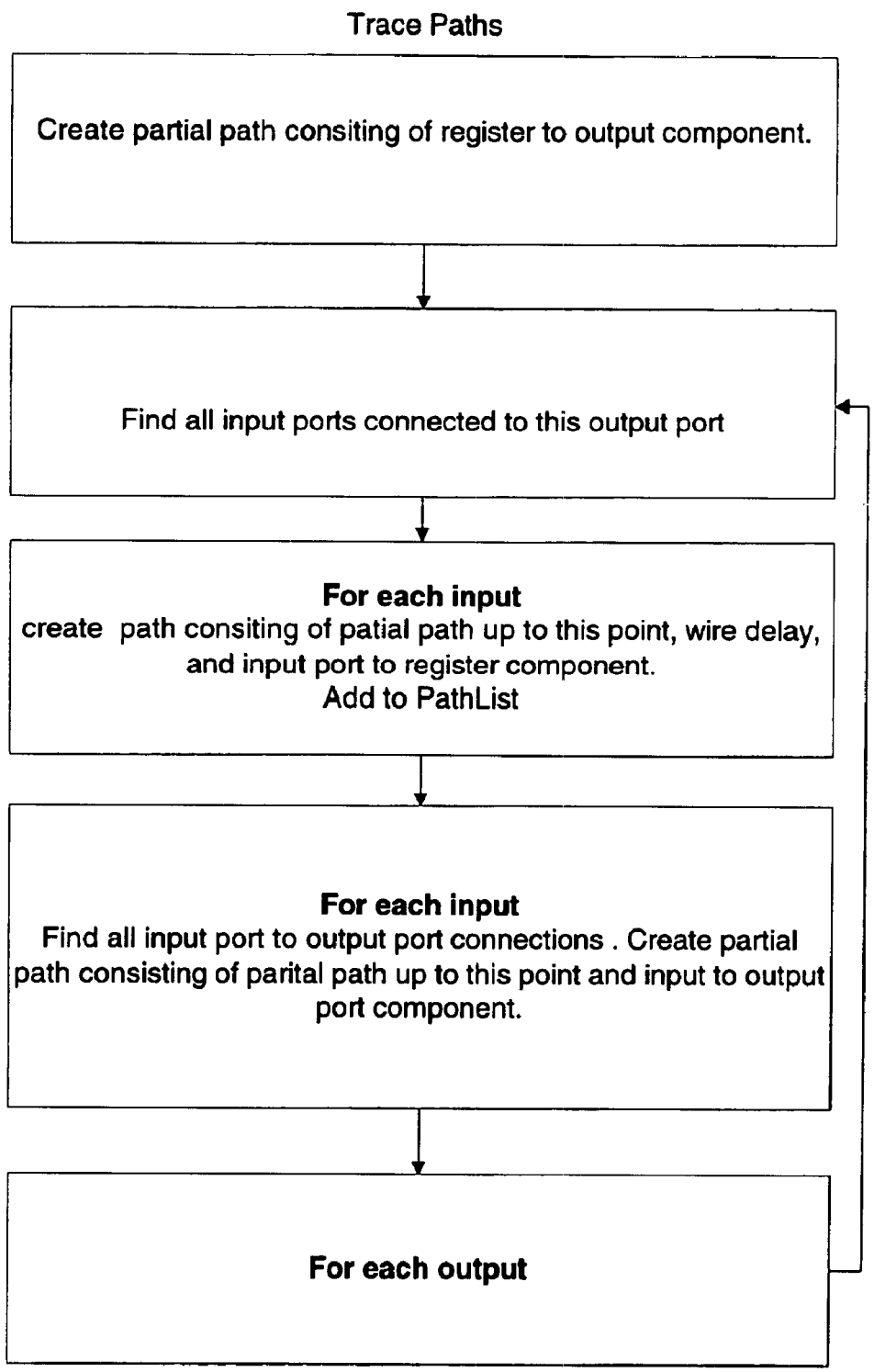
Figure 8C:
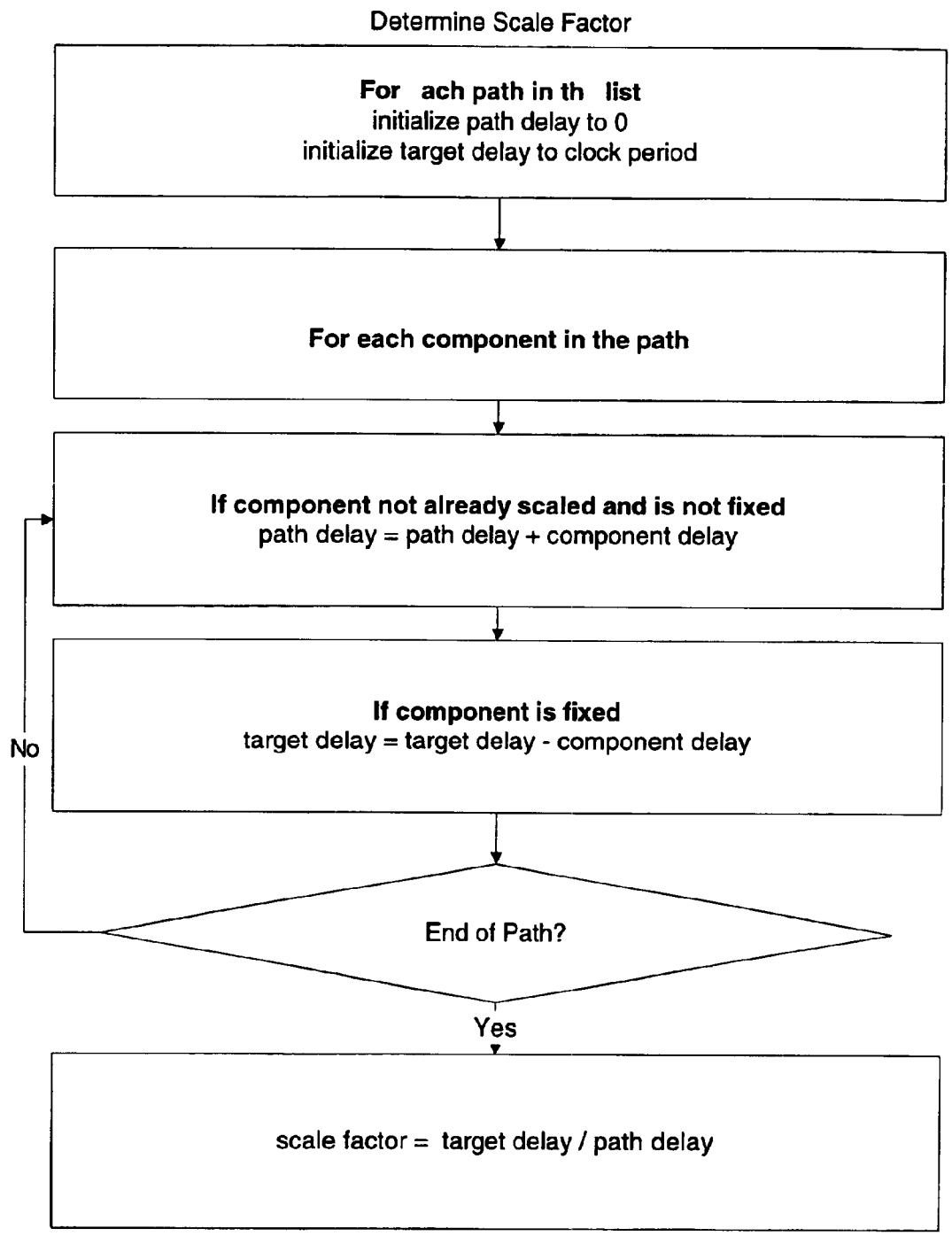
Figure 8D:
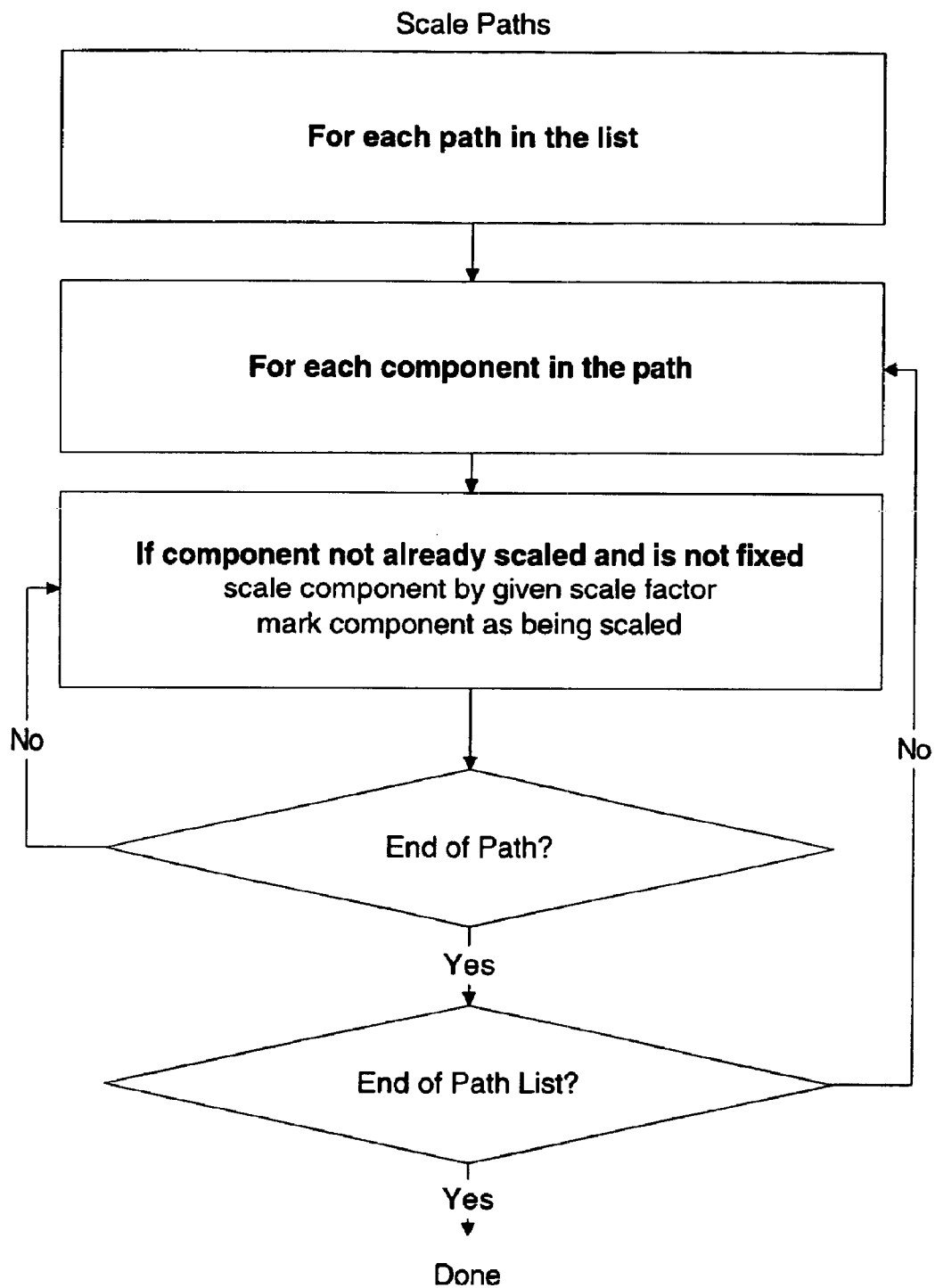

Optimizing the timing of the distributed multiplexed bus may result in the reduction of power, area, etc. Logic synthesis is a program that translates equations into optimized logic gates. In addition to the logic equations, synthesis may also accept constraints. Timing constraints can describe when inputs are available and when outputs are required. Logic synthesis tries to optimize the logic gates to best meet these constraints. In prior approaches, timing constraints may not have considered the position in the bus topology when generating constraints. This may lead to over-constraints and consequently a sub-optimal design in terms of area and/or power. One embodiment of the present invention considers the location of each agent in the bus topology when generating constraints. Constraints are generated after the signal wiring has been optimized. Based on prior characterization, an estimate is made for each component of timing which makes up the overall bus delay. The components include those that are scalable and those that are fixed. The scalable components may include the register to bus output (FIG. 5-A), bus input to bus output (FIG. 5-C, F), and bus input to register delays (FIG. 5-E, H). The fixed components may be the delays due to wiring between an output and an input ports (FIG. 5-B, D, G) based on the location of the agents. Using these components a delay calculation can be done on all of the paths which compose the bus. Given a multiplexed bus topology shown in FIG. 4A, a multiplexed bus in FIG. 4-B will be used. Applying the above optimizations will result in the path from D to A through B1 being optimized for better timing than the logically equivalent path from C to A through B2. Additionally, the size of the driver in node C will be reduced because that path is less critical than the path starting from E.

FIGS. 8A–8D illustrate one embodiment of the present invention for optimizing the timing constraints. The delay calculation is done by searching all possible paths from an output port and adding up the timing components which make up the path. A list of each unique path is kept track of along with its overall delay. Each of the components of the path is stored in the list for the scaling process.

The next procedure is to scale each path to meet the timing required by the bus. Paths which exceed the timing are scaled down to meet it by calculating a scale factor which reduces each scalable timing component. Paths which have timing less than that required are scaled up to meet it by calculating a scale factor which increases each scalable timing component. Scaling proceeds by starting with the longest delay paths, applying the path specific scaling factor to each component and marking each component as scaled. This process continues for each path generated above. The ordering and marking is important so as not to increase the delay on a timing component required by a longer path. By allowing more time (scaling up the timing components) logic synthesis my be able to select slower cells, which are smaller and use less power. The end result may be less area and/or less power requirements for the overall design.

FIG. 5 illustrates the effect of this process. In this configuration the constraints for path A,B,C,D,E are looser because the timing on the path through A,B,C,D,F,G,H is a longer path. Consequently, logic synthesis will optimize the timing from G, H more than that from D,E.

Multiple simultaneous drivers of the same signal may be legal for certain signals (like an error or interrupt signal), but illegal for other signals (like address). Simulator are able to detect multiple simultaneous tri-state drivers when they are driving conflicting values (one driver driving a 1 and another driving 0) and generate an X to aid in detecting design errors. Detecting multiple drivers in a distributed multiplexed bus is difficult because the combining function ("and-or" for example) may not enable the simulator to catch this design error, and the distributed nature of its implementation may make it hard to add a single checker. Another approach is to distribute the checking in each combiner function of the distributed multiplexer.

An "or" implementation of an N-bit combiner verilog logic equation is given below:

Output=(core_input & {N{core_enable}})|left_input|right_input

A checker to detect conflicts can look for cases where the core is enabled (core_input is not zero) and either the left or right input is not zero. Additionally, if both the left input and the right input is not zero then, there are multiple drivers. Table 1 (FIG. 7C) gives the truth table for detecting bus conflict. The verilog logic equations for this are:

error=(Core_enable && |(left_input|right_input))|(|left_input||right_input)

This may not catch the case where multiple cores are driving zero, however, the probability of this for multi-bit signals is relatively low, so this check is nearly as good as the more complicated check of all of the core enable signals. This can then be used to stop the simulation and report a design error as shown below:

```
if (error) begin
    $display("multiple drivers");
    $finish;
end
```

Thus, what has been disclosed is a method and apparatus for optimizing distributed multiplexed bus interconnects.

Figure 9:
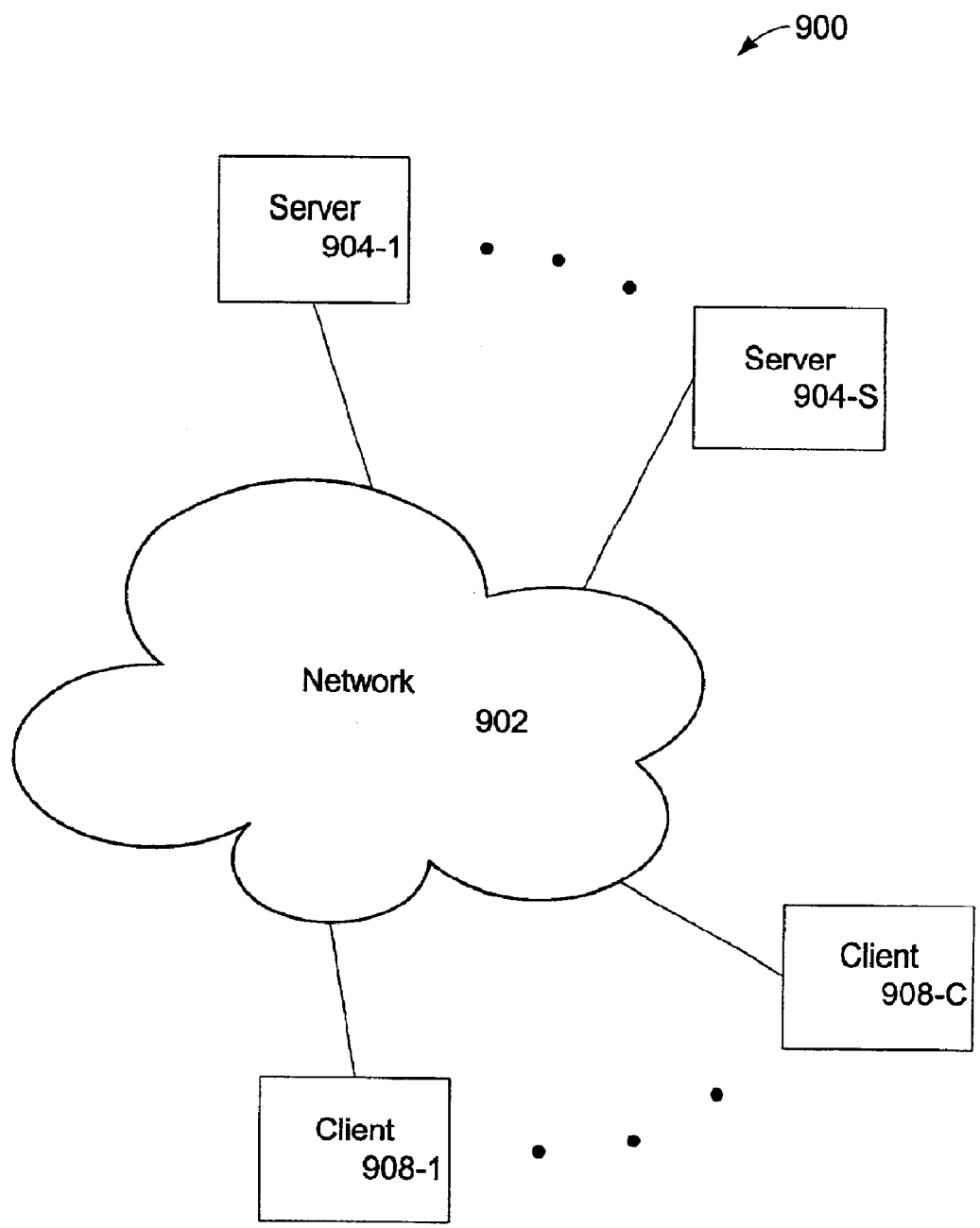
FIG. 9 illustrates a network environment in which the method and apparatus of the present invention may be implemented.

FIG. 9 illustrates a network environment 900 in which the techniques described may be applied. The network environment 900 has a network 902 that connects S servers 904-1 through 904-S, and C clients 908-1 through 108-C. As shown, several systems in the form of S servers 904-1 through 904-S and C clients 908-1 through 908-C are connected to each other via a network 1902, which may be, for example, an on-chip communication network. Note that alternatively the network 902 might be or include one or more of: inter-chip communications, an optical network, the Internet, a Local Area Network (LAN), Wide Area Network (WAN), satellite link, fiber network, cable network, or a combination of these and/or others. The servers may represent, for example: a master device on a chip; a memory; an intellectual property core, such as a microprocessor, communications interface, etc.; a disk storage system; and/or computing resources. Likewise, the clients may have computing, storage, and viewing capabilities. The method and apparatus described herein may be applied to essentially any type of communicating means or device whether local or remote, such as a LAN, a WAN, a system bus, on-chip bus, etc. It is to be further appreciated that the use of the term client and server is for clarity in specifying who initiates a communication (the client) and who responds (the server). No hierarchy is implied unless explicitly stated. Both functions may be in a single communicating device, in which case the client-server and server-client relationship may be viewed as peer-to-peer. Thus, if two devices such as 908-1 and 904-S can both initiate and respond to communications, their communication may be viewed as peer-to-peer. Likewise, communications between 904-1 and 904-S, and 908-1 and 908-C may be viewed as peer to peer if each such communicating device is capable of initiation and response to communication.

Figure 10:
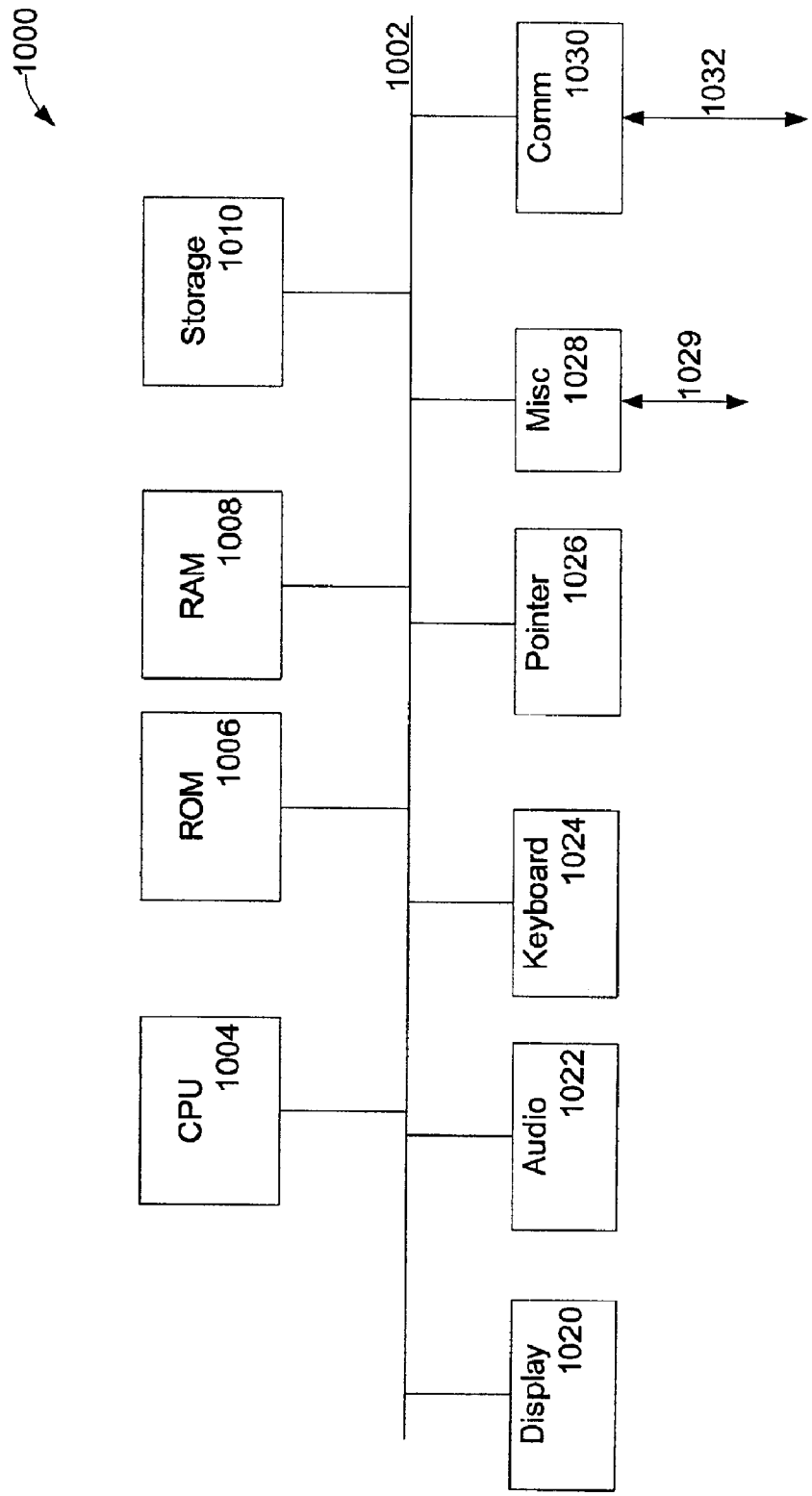
FIG. 10 is a block diagram of a computer system.

FIG. 10 illustrates a computer system 1000 in block diagram form, which may be representative of any of the clients and/or servers shown in FIG. 9. The block diagram is a high level conceptual representation and may be implemented in a variety of ways and by various architectures. Bus system 1002 interconnects a Central Processing Unit (CPU) 1004, Read Only Memory (ROM) 1006, Random Access Memory (RAM) 1008, storage 1010, display 1020, audio, 1022, keyboard 1024, pointer 1026, miscellaneous input/output (I/O) devices 1028, and communications 1030. The bus system 1002 may be for example, one or more of such buses as an on-chip bus, a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 1004 may be a single, multiple, or even a distributed computing resource. Storage 1010, may be Compact Disc (CD), Digital Versatile Disk (DVD), hard disks (HD), optical disks, tape, flash, memory sticks, video recorders, etc. Display 1020 might be, for example, a Cathode Ray Tube (CRT), Liquid Crystal Display (LCD), a projection system, Television (TV), etc. Note that depending upon the actual implementation of the system, the system may include some, all, more, or a rearrangement of components in the block diagram. For example, an on-chip communications system on an integrated circuit may lack a display 1020, keyboard 1024, and a pointer 1026. Another example may be a thin client might consist of a wireless hand held device that lacks, for example, a traditional keyboard. Thus, many variations on the system of FIG. 10 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "communicating" or "displaying" or the like, can refer to the action and processes of a computer system, or an electronic device, that manipulates and transforms data represented as physical (electronic) quantities within the electronic device or computer system's registers and memories into other data similarly represented as physical quantities within the electronic device and/or computer system memories or registers or other such information storage, transmission, or display devices.

The present invention can be implemented by an apparatus for performing the operations herein. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), digital versatile disk (DVD), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network. This communications network is not limited by size, and may range from, for example, on-chip communications to WANs such as the Internet.

The methods of the invention may be implemented using computer software. If written in a programming language conforming to a recognized standard, sequences of instructions designed to implement the methods can be compiled for execution on a variety of hardware platforms and for interface to a variety of operating systems. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical, or other form of propagated signals (e.g., carrier waves, infrared signals, digital signals, etc.); etc.

Thus, a method and apparatus for optimizing distributed multiplexed bus interconnects have been described.

What is claimed is:

1. A method of optimizing an interconnect, comprising:
optimizing an amount of signaling wiring present within a distributed multiplexed bus interconnect by eliminating individual signaling wires based upon whether an Intellectual Property core connected to the multiplexed bus interconnect transmits or receives signals from the multiplexed bus interconnect, wherein the multiplexed bus interconnect contains one or more multiplexers to route signals through the multiplexed bus interconnect.

2. The method of claim 1, wherein a first distributed node connecting to the distributed multiplexed bus interconnect contains combining logic that combines input signals from other nodes and has an output port to a next node that has fewer wires than present on its input port, wherein the combining logic and the signaling wiring between the first node and the other nodes supplying the input signals are eliminated when the other nodes supplying the input signals do not transmit signals to the distributed multiplexed bus interconnect.

3. The method of claim 2, wherein the combining logic and the signaling wiring between the first node and the other nodes supplying the input signals are only eliminated when sub-nodes connecting to the other nodes supplying the input signals also do not transmit signals to the distributed multiplexed bus interconnect.

4. The method of claim 2, wherein the nodes that do have combining logic are connected together in a tree structure after optimization occurs.

5. The method of claim 4, wherein the removal of unnecessary signal wiring is performed from the bottom of the tree up.

6. The method of claim 1, wherein a first distributed node connecting to the distributed multiplexed bus interconnect contains combining logic that combines input signals from other nodes and has an output to a next node, wherein the combining logic and the signaling wiring between the first node and the other nodes supplying the input signals are eliminated when the input signals being transmitting by the other nodes are a constant signal.

7. The method of claim 1, wherein a first distributed node connecting to the distributed multiplexed bus interconnect contains repeater logic to retransmit to a second node a received signal, wherein the repeater logic and the signaling wiring between the first distributed node and the second distributed node are eliminated when the second node and sub nodes connected to the second node do not receive signals from the distributed multiplexed bus interconnect.

8. The method of claim 1, wherein optimizing further comprises removal from a node connected to the distributed multiplexed bus interconnect selected from the group consisting of combining logic, repeater logic, signaling wiring to a connected node, and root logic.

9. The method of claim 1, wherein the optimizing is done at a point in time before fabrication of a device containing the distributed multiplexed bus interconnect.

10. A processing system, comprising:
processor, which when executing a set of instructions performs the method of claim 1.

11. A machine-readable medium having stored thereon instructions, which when executed performs the method of claim 1.

12. A method to optimize bus interconnect wiring and logic, comprising:
(a) marking all potential bus signals as unoptimized with an interconnect optimizing program;
(b) determining if all of the bus signals have been optimized; and
if so, then stopping;
else,
(c) selecting a first unoptimized bus signal;
(d) eliminating signal wiring and replacing combiner logic with repeater logic for nodes in a signal path of the first unoptimized bus signal that will not combine two or more input signals;
(e) eliminating wiring and repeater logic for nodes in the signal path of the first unoptimized bus signal that will not need to retransmit the first unoptimized bus signal to another node;

(f) marking the first unoptimized bus signal as optimized; and (g) looping to (b).

13. The method of claim 12, further comprising:

identifying a first node with a connection between a combiner logic tree and a repeater logic tree where an only input to a first combiner logic in the first node is an output wire from a second combiner logic from a second node;

connecting the output wire from the second node to an input of a first repeater logic in the second node; and removing the first combiner logic in first node and connecting an input wire of the first combiner logic to an input of a second repeater logic in the first node.

14. A method to optimize bus logic, comprising:

determining if a first node has a function to transmit a signal onto a multiplexed bus interconnect;

determining if a sub node connected in a transmit signal path of the first node has a function to transmit a signal onto the multiplexed bus interconnect;

adding combining logic to combine input signals into the first node if it is determined that the first node or the sub node has the function to transmit a signal onto the multiplexed bus interconnect; and adding combining logic to nodes in the transmit signal path until a second node in the transmit signal path contains root logic that connects the transmit signal path to a receive signal path.

15. A method to optimize bus logic, comprising:

determining if a first node has a function to receive a signal from a multiplexed bus interconnect;

determining if a sub node connected in a receive signal path of the first node has a function to receive a signal from the multiplexed bus interconnect;

adding repeater logic to retransmit input signals to the first node from a second node if it is determined that the first node or the sub node connected to the first node has the function to receive a signal from the multiplexed bus interconnect; and adding receiver logic to nodes in the receive signal path until a third node in the receive signal path contains root logic that connects a transmit signal path to the receive signal path.

16. An apparatus, comprising:

means for optimizing an amount of signaling wiring present within a distributed multiplexed bus interconnect by eliminating individual signaling wires based upon whether an Intellectual Property core connected to the multiplexed bus interconnect transmits or receives signals from the multiplexed bus interconnect, wherein the multiplexed bus interconnect contains one or more multiplexers to route signals through the multiplexed bus interconnect.

17. The apparatus of claim 16 wherein the optimizing of the amount of signaling wires occurs before the apparatus is fabricated.

18. The apparatus of claim 16 wherein the means for optimizing optimizes at a point in time prior to the fabrication of a device containing the multiplexed bus interconnect.

19. A machine-readable medium having stored thereon information representing the apparatus of claim 16.

20. A system, comprising:

a plurality of agents;

a plurality of interfaces; and a multiplexed bus interconnect containing one or more multiplexers to route signals through the multiplexed bus interconnect connects to the plurality of agents, wherein an amount of signaling wiring connecting to the plurality of agents is optimized by eliminating individual signaling wires based upon whether an Intellectual Property core associated with a particular agent transmits signals onto the multiplexed bus interconnect or receives signals from the multiplexed bus interconnect.

21. The system of claim 20, wherein the multiplexed bus interconnect connecting the plurality of agents is further optimized by at least one of combiner logic optimization, repeater logic optimization, and root logic optimization.

22. The system of claim 21, wherein the optimization is done at a time of system design.

23. A method of optimizing timing in a multiplexed bus interconnect, comprising:

accepting a timing constraint for the multiplexed bus connection;

determining locations for a plurality of agents along the distributed multiplexed bus connection;

generating scaling factors for the plurality of agents to meet the timing constraint based upon the determined locations of each agent; and selecting components for each agent that consume a least amount of power and still meet the timing constraint.

24. The method of claim 23 wherein the scaling factors may be applied to scalable components selected from the group consisting of register to bus output, bus input to bus output, bus input to register delays, and buffer delays.

25. A processing system comprising a processor, which when executing a set of instructions performs the method of claim 23.

26. A machine-readable medium having stored thereon instructions, which when executed performs the method of claim 23.

27. An apparatus to optimize bus logic, comprising:

means for determining if a first node has a function to receive a signal from a multiplexed bus interconnect;

means for determining if a sub node connected in a receive signal path of the first node has a function to receive a signal from the multiplexed bus interconnect;

means for adding repeater logic to retransmit input signals to the first node from a second node if it is determined that the first node or the sub node connected to the first node has the function to receive a signal from the multiplexed bus interconnect; and means for adding receiver logic to nodes in the receive signal path until a third node in the receive signal path contains root logic that connects a transmit signal path to the receive signal path.

28. An apparatus to optimize timing in a multiplexed bus interconnect, comprising:

means for accepting a timing constraint for the multiplexed bus connection;

means for determining locations for a plurality of agents along the distributed multiplexed bus connection;

means for generating scaling factors for the plurality of agents to meet the timing constraint based upon the determined locations of each agent; and means for selecting components for each agent that consume a least amount of power and still meet the timing constraint.

* * * * *